(12) United States Patent
Sugawara

(10) Patent No.: US 8,936,050 B2
(45) Date of Patent: Jan. 20, 2015

(54) LID OPENING AND CLOSING DEVICE

(75) Inventor: Yudo Sugawara, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 231 days.

(21) Appl. No.: 13/420,097

(22) Filed: Mar. 14, 2012

(65) Prior Publication Data

US 2012/0237323 A1     Sep. 20, 2012

(30) Foreign Application Priority Data

Mar. 16, 2011   (JP) .................................. 2011-58098

(51) Int. Cl.
*H01L 21/673*   (2006.01)
*H01L 21/677*   (2006.01)

(52) U.S. Cl.
CPC ............... *H01L 21/67772* (2013.01)
USPC ............................ 141/98; 414/217.1; 141/64

(58) Field of Classification Search
USPC .......... 141/3, 63, 64, 98; 414/217.1; 206/710, 206/832
See application file for complete search history.

(56) References Cited

U.S. PATENT DOCUMENTS

| | | | | |
|---|---|---|---|---|
| 5,320,218 A | * | 6/1994 | Yamashita et al. | 206/213.1 |
| 5,586,585 A | * | 12/1996 | Bonora et al. | 141/93 |
| 5,810,538 A | * | 9/1998 | Ozawa et al. | 414/217 |
| 6,135,168 A | * | 10/2000 | Yang et al. | 141/98 |
| 6,382,896 B1 | * | 5/2002 | Hu et al. | 414/217 |
| 6,398,475 B1 | * | 6/2002 | Ishikawa | 414/217 |
| 6,425,722 B1 | * | 7/2002 | Ueda et al. | 414/217 |
| 6,799,932 B2 | * | 10/2004 | Davis et al. | 414/217.1 |
| 6,842,221 B1 | * | 1/2005 | Shiraishi | 355/30 |
| 7,077,173 B2 | * | 7/2006 | Tokunaga | 141/66 |
| 7,112,027 B2 | * | 9/2006 | Nagata | 414/411 |
| 7,275,905 B2 | * | 10/2007 | Lee | 414/217 |
| 7,314,068 B2 | * | 1/2008 | Nakano et al. | 141/7 |
| 7,654,291 B2 | * | 2/2010 | Miyajima et al. | 141/63 |
| 7,674,083 B2 | * | 3/2010 | Miyajima et al. | 414/217.1 |
| 7,841,371 B2 | * | 11/2010 | Okabe | 141/63 |
| 7,918,251 B2 | * | 4/2011 | Yu et al. | 141/63 |
| 7,927,058 B2 | * | 4/2011 | Miyajima et al. | 414/217.1 |
| 8,082,955 B2 | * | 12/2011 | Okabe | 141/51 |

(Continued)

FOREIGN PATENT DOCUMENTS

| | | |
|---|---|---|
| JP | 06-501815 A | 2/1994 |
| JP | 09-139410 A | 5/1997 |

(Continued)

*Primary Examiner* — Jason K Niesz
*Assistant Examiner* — Andrew Schmid
(74) *Attorney, Agent, or Firm* — Nath, Goldberg & Meyer; Jerald L. Meyer

(57) ABSTRACT

A lid opening and closing device for a semiconductor manufacturing apparatus having a partition wall configured to divide a carrier conveying region and a substrate conveying region, the partition wall having a conveying gateway with an edge portion, includes an exhaust port configured to discharge therethrough an atmospheric gas from a closed space formed between a carrier making contact with the edge portion of the conveying gateway and an opening/closing door, and a purge gas injecting part provided in the opening/closing door. The purge gas injecting part is configured to enter the internal space of a carrier lid through an opening formed on the front surface of the carrier lid, to inject a purge gas into the internal space of the carrier lid and to discharge an atmospheric gas existing in the internal space of the carrier lid into the closed space through another opening of the carrier lid.

6 Claims, 15 Drawing Sheets

(56) References Cited

U.S. PATENT DOCUMENTS

| | | | |
|---|---|---|---|
| 8,171,964 B2* | 5/2012 | Okabe | 141/63 |
| 8,522,836 B2* | 9/2013 | Okabe et al. | 141/286 |
| 8,591,163 B2* | 11/2013 | Toyoda et al. | 414/411 |
| 8,609,526 B2* | 12/2013 | Liu et al. | 438/614 |
| 2002/0069933 A1* | 6/2002 | Otaguro | 141/98 |
| 2003/0031538 A1* | 2/2003 | Weaver | 414/217.1 |
| 2003/0047233 A1* | 3/2003 | Rush et al. | 141/98 |
| 2004/0099333 A1* | 5/2004 | Tsai et al. | 141/98 |
| 2004/0168742 A1* | 9/2004 | Kim et al. | 141/98 |
| 2005/0173358 A1* | 8/2005 | Oyama | 211/41.18 |
| 2006/0011580 A1* | 1/2006 | Shimizu | 216/67 |
| 2006/0088406 A1* | 4/2006 | Miyajima et al. | 414/805 |
| 2006/0151404 A1* | 7/2006 | Blattner et al. | 211/41.18 |
| 2006/0196527 A1* | 9/2006 | Nishimura et al. | 134/2 |
| 2006/0207680 A1* | 9/2006 | Takamura | 141/98 |
| 2006/0292037 A1* | 12/2006 | Favre et al. | 422/68.1 |
| 2007/0269294 A1* | 11/2007 | Nagasaka et al. | 414/217.1 |
| 2007/0274810 A1* | 11/2007 | Holtkamp et al. | 414/217 |
| 2008/0000551 A1* | 1/2008 | Sato et al. | 148/222 |
| 2008/0057344 A1* | 3/2008 | Murakami et al. | 428/698 |
| 2008/0063496 A1* | 3/2008 | Bufano et al. | 414/331.01 |
| 2008/0080963 A1* | 4/2008 | Bufano et al. | 414/788 |
| 2008/0107507 A1* | 5/2008 | Bufano et al. | 414/217.1 |
| 2008/0134483 A1* | 6/2008 | Aburatani | 29/25.01 |
| 2008/0175694 A1* | 7/2008 | Park et al. | 414/217.1 |
| 2008/0233764 A1* | 9/2008 | Takahashi et al. | 438/785 |
| 2008/0236487 A1* | 10/2008 | Hirano et al. | 118/715 |
| 2008/0260502 A1* | 10/2008 | Aburatani | 414/226.04 |
| 2009/0092940 A1* | 4/2009 | Hishiya et al. | 432/36 |
| 2009/0101472 A1* | 4/2009 | Hishiya et al. | 198/474.1 |
| 2009/0114150 A1* | 5/2009 | Yoneda et al. | 118/696 |
| 2009/0142166 A1* | 6/2009 | Miyajima et al. | 414/217.1 |
| 2009/0143890 A1* | 6/2009 | Morisawa | 700/108 |
| 2009/0185892 A1* | 7/2009 | Aburatani | 414/806 |
| 2009/0272743 A1* | 11/2009 | Meulen | 220/230 |
| 2010/0054897 A1* | 3/2010 | Bufano et al. | 414/217.1 |
| 2010/0055312 A1* | 3/2010 | Kato et al. | 427/255.26 |
| 2010/0055315 A1* | 3/2010 | Honma | 427/255.28 |
| 2010/0098517 A1* | 4/2010 | Hishiya | 414/160 |
| 2010/0132611 A1* | 6/2010 | Koyama | 118/696 |
| 2010/0151131 A1* | 6/2010 | Obara et al. | 427/255.28 |
| 2010/0175781 A1* | 7/2010 | Kisakibaru et al. | 141/98 |
| 2010/0260936 A1* | 10/2010 | Kato et al. | 427/255.28 |
| 2011/0210042 A1* | 9/2011 | Okabe et al. | 206/710 |
| 2011/0265725 A1* | 11/2011 | Tsuji et al. | 118/725 |
| 2012/0017667 A1* | 1/2012 | Iikawa et al. | 73/23.39 |
| 2012/0071001 A1* | 3/2012 | Ode | 438/758 |
| 2012/0237323 A1* | 9/2012 | Sugawara | 414/411 |
| 2012/0241032 A1* | 9/2012 | Sugawara | 137/544 |
| 2012/0251967 A1* | 10/2012 | Matsuura | 432/247 |
| 2012/0289058 A1* | 11/2012 | Hirano et al. | 438/758 |
| 2012/0315114 A1* | 12/2012 | Oyama et al. | 414/222.01 |
| 2013/0072034 A1* | 3/2013 | Yashima et al. | 438/795 |
| 2013/0085593 A1* | 4/2013 | Oosterlaken | 700/112 |
| 2013/0089396 A1* | 4/2013 | Bufano et al. | 414/222.01 |
| 2013/0319332 A1* | 12/2013 | Gokon | 118/722 |

FOREIGN PATENT DOCUMENTS

| | | |
|---|---|---|
| JP | 2002-151584 A | 5/2002 |
| JP | 2002-522896 A | 7/2002 |
| JP | 2010-56296 JP | 3/2010 |

* cited by examiner

LID OPENING AND CLOSING DEVICE

CROSS-REFERENCE TO RELATED APPLICATION

This application claims the benefit of Japanese Patent Application No. 2011-058098, filed on Mar. 16, 2011, in the Japan Patent Office, the disclosure of which is incorporated herein in its entirety by reference.

TECHNICAL FIELD

The present disclosure relates to a lid opening and closing device for opening and closing a lid that blocks a substrate takeout opening, which forms a part of a FOUP (Front Opening Unified Pod).

BACKGROUND

As one example of semiconductor manufacturing, there is available a vertical heat treatment apparatus for thermally treating, e.g., a plurality of semiconductor wafers (hereinafter referred to as wafers) in a batch-wise manner. The vertical heat treatment apparatus is installed in an air atmosphere. The vertical heat treatment apparatus includes a carrier conveying region in which a wafer-holding carrier called a FOUP is conveyed. The vertical heat treatment apparatus also includes a wafer conveying region in which wafers are transferred to a wafer boat as a substrate holding mechanism and are conveyed to a heat treatment furnace. A partition wall is formed between the carrier conveying region and the wafer conveying region. In order to maintain the cleanliness of the wafer conveying region higher than that of the carrier conveying region and to prevent generation of natural oxide films on the wafers, the atmosphere of the wafer conveying region is converted from the air to nitrogen, thereby keeping the oxygen concentration low. It is sometimes required that the oxygen concentration be reduced to, e.g., several ppm or less.

A conveying gateway for the wafers is formed in the partition wall. The conveying gateway is opened and closed by an opening/closing door conforming to a FIMS (Front-Opening Interface Mechanical Standard). The opening/closing door is provided with a removal mechanism for removing a lid installed on the front surface of a carrier. In other words, the opening/closing door is required to open and close the lid to transfer the wafers between the inside of the carrier and the wafer conveying region, and to isolate the wafer conveying region from the carrier conveying region to keep the wafer conveying region at a low oxygen concentration.

The lid removing process will be described in more detail. In a state where the front surface of the carrier remains in contact with the partition wall, the removal mechanism acts on an engaging mechanism installed within the internal space of the lid and arranged to bring the lid into engagement with the carrier, thereby releasing the engagement. Then the opening/closing door and the lid removal mechanism are moved toward the wafer conveying region in a state where the released lid is held by the lid removal mechanism, whereby the inside of the carrier is opened to the wafer conveying region. When the opening/closing door is moved in this manner, the air staying within the internal space is leaked to the wafer conveying region. Consequently, the nitrogen concentration in the wafer conveying region is reduced and the oxygen concentration in the wafer conveying region is increased. As a result, it may become impossible to subject the wafers to a desired treatment.

SUMMARY

The present disclosure provides a technology capable of restraining an ambient gas within a FOUP conveying region from infiltrating into a substrate conveying region through an internal space of a lid.

According to some embodiments of the present disclosure, there is provided a lid opening and closing device for a semiconductor manufacturing apparatus which includes: a partition wall configured to divide a carrier conveying region and a substrate conveying region, the partition wall having a conveying gateway with an edge portion; a carrier including a carrier body and a carrier lid configured to removably engage with the carrier body, the carrier body having a substrate takeout opening with an edge part, the carrier lid having an internal space and an opening on the front surface thereof, the edge part of the substrate takeout opening of the carrier body being configured to make contact with the edge portion of the conveying gateway; and an opening/closing door configured to open and close the conveying gateway, the opening/closing door including a lid removal mechanism configured to enter the carrier lid to release engagement of the carrier lid with the carrier body and to hold the carrier lid, the lid opening and closing device comprising: an exhaust port configured to discharge therethrough an atmospheric gas from a closed space formed between the carrier making contact with the edge portion of the conveying gateway and the opening/closing door; and a purge gas injecting part provided in the opening/closing door, the purge gas injecting part configured to enter the internal space of the carrier lid through the above opening of the carrier lid, to inject a purge gas into the internal space of the carrier lid and to discharge an atmospheric gas existing in the internal space of the carrier lid into the closed space through another opening of the carrier lid.

According to another embodiment of the present disclosure, there is provided a lid opening and closing device for a semiconductor manufacturing apparatus which includes: a partition wall configured to divide a carrier conveying region and a substrate conveying region, the partition wall having a conveying gateway with an edge portion; a carrier including a carrier body and a carrier lid configured to removably engage with the carrier body, the carrier body having a substrate takeout opening with an edge part, the carrier lid having an internal space and an opening on the front surface thereof, the edge part of the substrate takeout opening of the carrier body being configured to make contact with the edge portion of the conveying gateway; and an opening/closing door configured to open and close the conveying gateway, the opening/closing door including a lid removal mechanism configured to enter the carrier lid to release engagement of the carrier lid with the carrier body and to hold the carrier lid, the lid opening and closing device including: an exhaust port configured to discharge therethrough an atmospheric gas from a closed space formed between the carrier making contact with the edge portion of the conveying gateway and the opening/closing door; and an exhaust part provided in the opening/closing door, the exhaust part configured to enter the internal space of the carrier lid through the above opening of the carrier lid and to discharge therethrough an atmospheric gas existing in the internal space of the carrier lid.

According to a further embodiment of the present disclosure, there is provided a lid opening and closing device for a semiconductor manufacturing apparatus which includes: a partition wall configured to divide a carrier conveying region and a substrate conveying region, the partition wall having a conveying gateway with an edge portion; a carrier including a carrier body and a carrier lid configured to removably engage with the carrier body, the carrier body having a substrate takeout opening with an edge portion, the carrier lid having an internal space and an opening on the front surface thereof, the edge part of the substrate takeout opening of the carrier body being configured to make contact with the edge portion of the conveying gateway; and an opening/closing door configured to open and close the conveying gateway, the opening/closing door including a lid removal mechanism configured to enter the carrier lid to release engagement of the carrier lid with the carrier body and to hold the carrier lid, the lid opening and closing device including: an exhaust port configured to discharge therethrough an atmospheric gas from a closed space formed between the carrier making contact with the edge portion of the conveying gateway and the opening/closing door; and a purge gas injecting part including an opposing surface facing a front surface of the carrier lid and a plurality of purge gas injecting holes formed on the opposing surface, the lid removal mechanism provided in the purge gas injecting part, the purge gas injecting part configured to inject a purge gas into the internal space of the carrier lid through the above opening of the carrier lid and to discharge an atmospheric gas existing in the internal space of the carrier lid into the closed space through another opening of the carrier lid.

According to a still further embodiment of the present disclosure, there is provided a lid opening and closing device for a semiconductor manufacturing apparatus which includes: a partition wall configured to divide a carrier conveying region and a substrate conveying region, the partition wall having a conveying gateway with an edge portion; a carrier including a carrier body and a carrier lid configured to removably engage with the carrier body, the carrier body having a substrate takeout opening with an edge part, the carrier lid having an internal space and an opening on the front surface thereof, the edge part of the substrate takeout opening of the carrier body being configured to make contact with the edge portion of the conveying gateway; and an opening/closing door configured to open and close the conveying gateway, the opening/closing door including a lid removal mechanism configured to enter the carrier lid to release engagement of the carrier lid with the carrier body and to hold the carrier lid, the lid opening and closing device including: an exhaust port configured to discharge therethrough an atmospheric gas from a closed space formed between the carrier making contact with the edge portion of the conveying gateway and the opening/closing door; and an exhaust part including an opposing surface facing a front surface of the carrier lid and a plurality of exhaust holes formed on the opposing surface, the lid removal mechanism provided in the exhaust part, the exhaust part configured to discharge an atmospheric gas existing in the internal space of the carrier lid through the above opening of the carrier lid.

The term "FOUP" used herein is an abbreviation of Front Opening Unified Pod and refers to, in some embodiments, a carrier for conveying and preserving wafers of 300 mm in diameter. The substrates to be stored within the FOUP are not limited to the wafers as described and the diameter of the substrates is not limited to 300 mm. The mechanism for bringing a FOUP body and a FOUP lid into engagement with each other is not limited to the configuration in which a linear movement part is moved up and down by the rotation of a rotary part as described, but includes all the configurations in which engagement is released by a lid removal mechanism coming into the lid.

BRIEF DESCRIPTION OF THE DRAWINGS

The accompanying drawings, which are incorporated in and constitute a part of the specification, illustrate various embodiments of the present disclosure, and together with the general description given above and the detailed description of various embodiments given below, serve to explain the principles of the present disclosure.

DETAILED DESCRIPTION

<First Embodiment>

Figure 1:
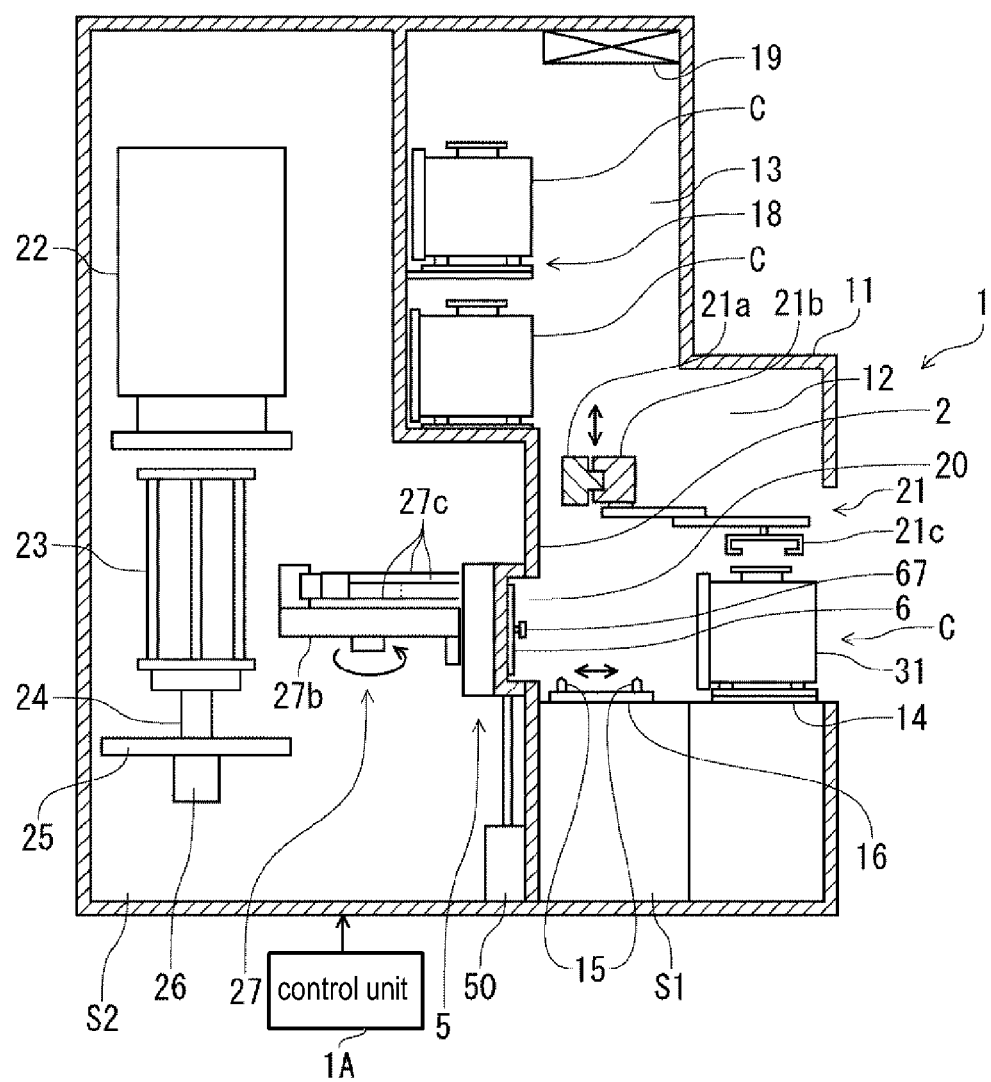
FIG. 1 is a vertical side sectional view of a vertical heat treatment apparatus employing a lid opening and closing device of the present disclosure.
Figure 2:
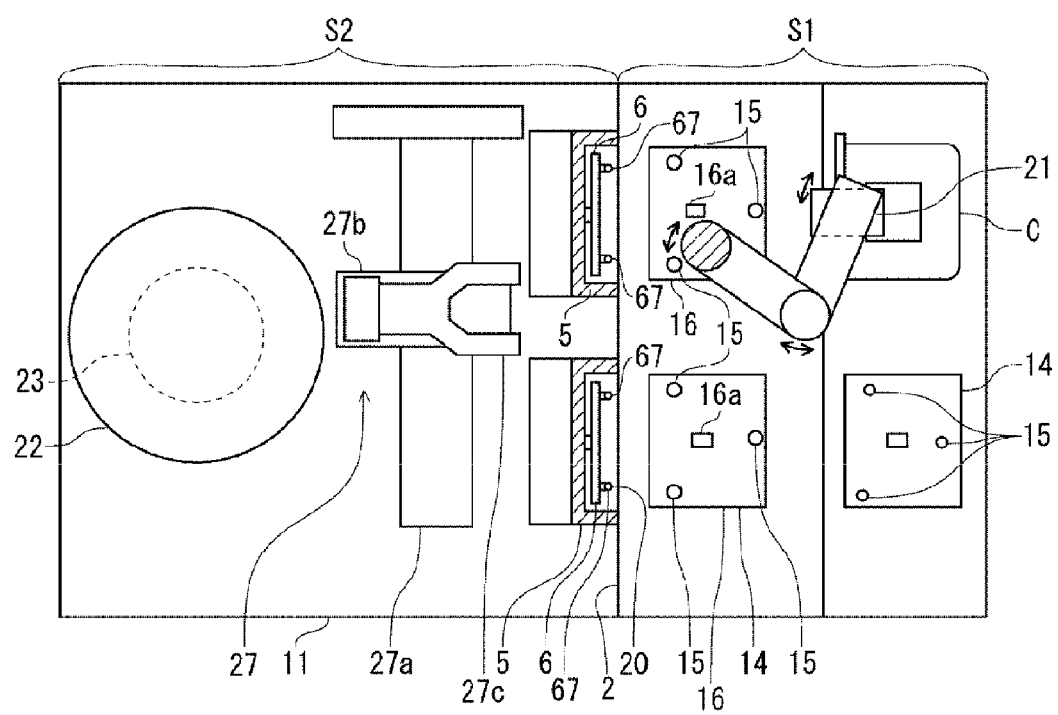
FIG. 2 is a plan view of the vertical heat treatment apparatus.

Description will now be made on a vertical heat treatment apparatus having a lid opening and closing device according to the present disclosure installed therein. FIG. 1 is a vertical side sectional view of a vertical heat treatment apparatus 1. FIG. 2 is a plan view of the vertical heat treatment apparatus 1. In the figures, reference numeral 11 refers to a housing that constitutes an outer shell of the vertical heat treatment apparatus 1. The internal space of the housing 11 is divided into a carrier conveying region S1 in which a carrier C as a container for storing wafers W to be processed is carried into and out of the vertical heat treatment apparatus and a wafer conveying region S2 as a transferring region in which the wafers W stored within the carrier C are conveyed and carried into a heat treatment furnace to be set forth later. The carrier C is the FOUP stated above.

The carrier conveying region S1 and the wafer conveying region S2 is divided by a partition wall 2. The carrier conveying region Si is kept in an air atmosphere. The wafer conveying region S2, on the other hand, is kept in an inert gas atmosphere, e.g., nitrogen ($N_2$) gas atmosphere, in order to prevent formation of oxide films on the wafers W being carried in. The wafer conveying region S2 is higher in cleanliness but lower in oxygen concentration than the carrier conveying region S1. In the following description, the arranging direction of the carrier conveying region S1 and the wafer conveying region S2 will be defined as the front-rear direction of the vertical heat treatment apparatus 1.

Description will be made on the carrier conveying region S1. The carrier conveying region S1 includes a first conveying region 12 and a second conveying region 13 positioned at the rear side of the first conveying region 12 (at the side of the wafer conveying region S2). Two first tables 14 for respectively mounting the carriers C thereon are installed at the left and right sides of the first conveying region 12. Pins 15 for positioning the carrier C are installed, e.g., at three points, on the loading surface of each of the first tables 14.

Two second tables 16 are arranged at the left and right sides of the second conveying region 13, as shown in FIG. 2, so that the second tables 16 can be arranged in the front-rear direction with respect to the first tables 14. Each of the second tables 16 is movable in the front-rear direction. In the same manner as the first tables 14, pins 15 for positioning the carrier C are installed at three points on the loading surface of each of the second tables 16. A hook 16a for fixing the carrier C is installed on the loading surface of each of the second tables 16. A carrier storage part 18 for storing the carrier C is provided at the upper side of the second conveying region 13. The carrier storage part 18 is formed of two or more racks, each of which can support two carriers C side by side in the left-right direction. In the example shown in FIG. 1, the racks are provided in two stages.

In the second conveying region 13, there is installed a carrier conveying mechanism 21 for conveying the carrier C between the first tables 14, the second tables 16 and the carrier storage part 18. The carrier conveying mechanism 21 includes a guide part 21a extending in the left-right direction and capable of moving up and down, a moving part 21b movable in the left-right direction under the guidance of the guide part 21a and an articulated arm 21c attached to the moving part 21b and arranged to hold and horizontally convey the carrier C. A filter unit 19 including a HEPA filter or a ULPA filter is provided in the ceiling portion of the second conveying region 13. Air is purified by the filter unit 19 and is supplied downward.

In the partition wall 2, there is provided a conveying gateway 20 for the wafers W through which the carrier conveying region S1 and the wafer conveying region S2 communicate with each other. An opening/closing door 5 for blocking the conveying gateway 20 from the side of the wafer conveying region S2 is installed at the conveying gateway 20. A drive mechanism 50 is connected to the opening/closing door 5. The opening/closing door 5 can be moved by the drive mechanism 50 in the front-rear direction and the up-down direction, thereby opening and closing the conveying gateway 20. Configurations around the opening/closing door 5 and the conveying gateway 20 will be described later in more detail.

A heat treatment furnace 22 of a vertical-type having an open lower end as a furnace throat is installed at the wafer conveying region S2. At the lower side of the heat treatment furnace 22, a wafer boat 23 for holding a plurality of wafers W in a shelf-like manner is loaded on a cap 25 through a heat insulating portion 24. The cap 25 is supported on a lift mechanism 26. The wafer boat 23 is carried into or out of the heat treatment furnace 22 by the lift mechanism 26.

A wafer conveying mechanism 27 is installed between the wafer boat 23 and the conveying gateway 20 of the partition wall 2. The wafer conveying mechanism 27 includes a guide mechanism 27a extending in the left-right direction, a moving body 27b movable along the guide mechanism 27a and rotatable about a vertical axis, and five retractable arms 27c attached to the moving body 27b. The wafer conveying mechanism 27 conveys the wafers W between the wafer boat 23 and the carrier C on the second tables 16.

Figure 3:
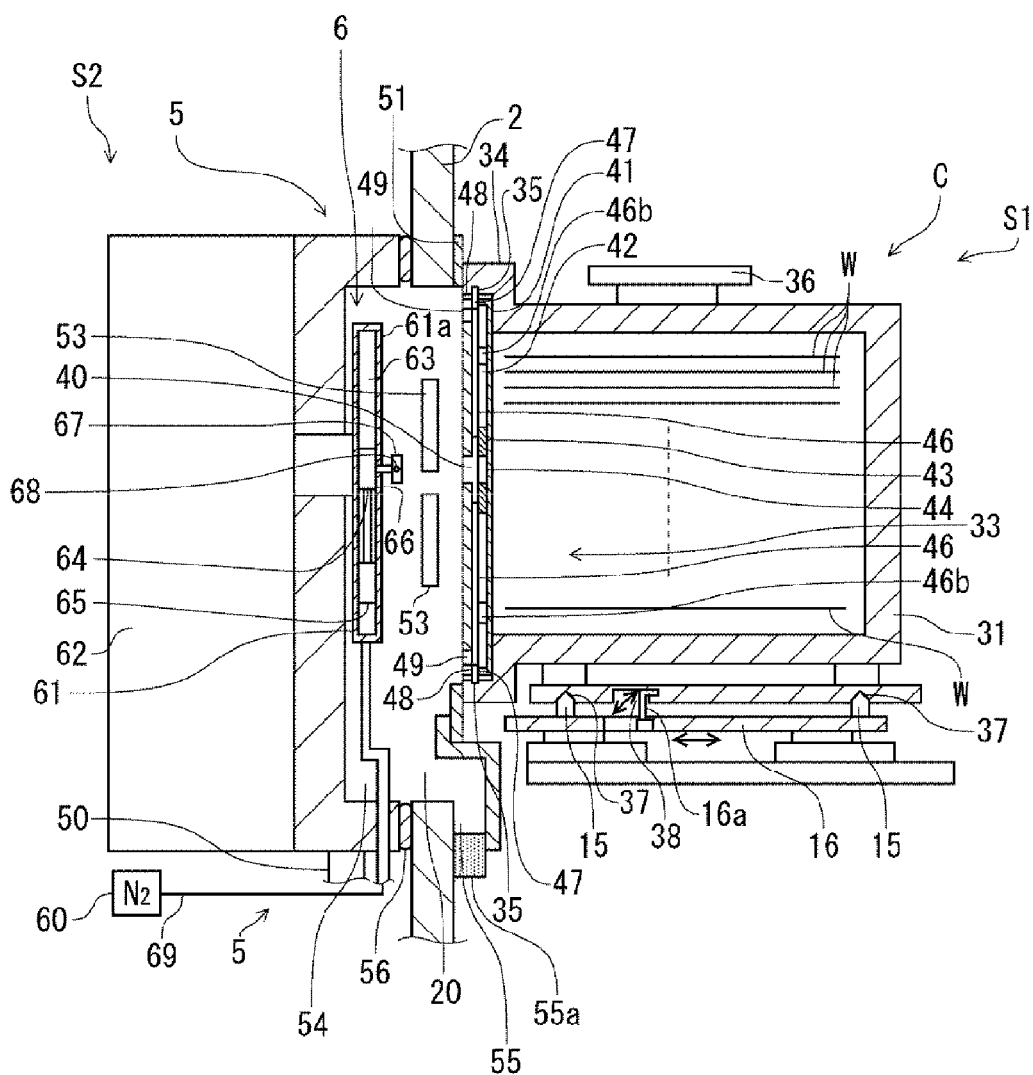
FIG. 3 is a vertical side sectional view of a carrier and an opening/closing door installed in the vertical heat treatment apparatus.
Figure 4:
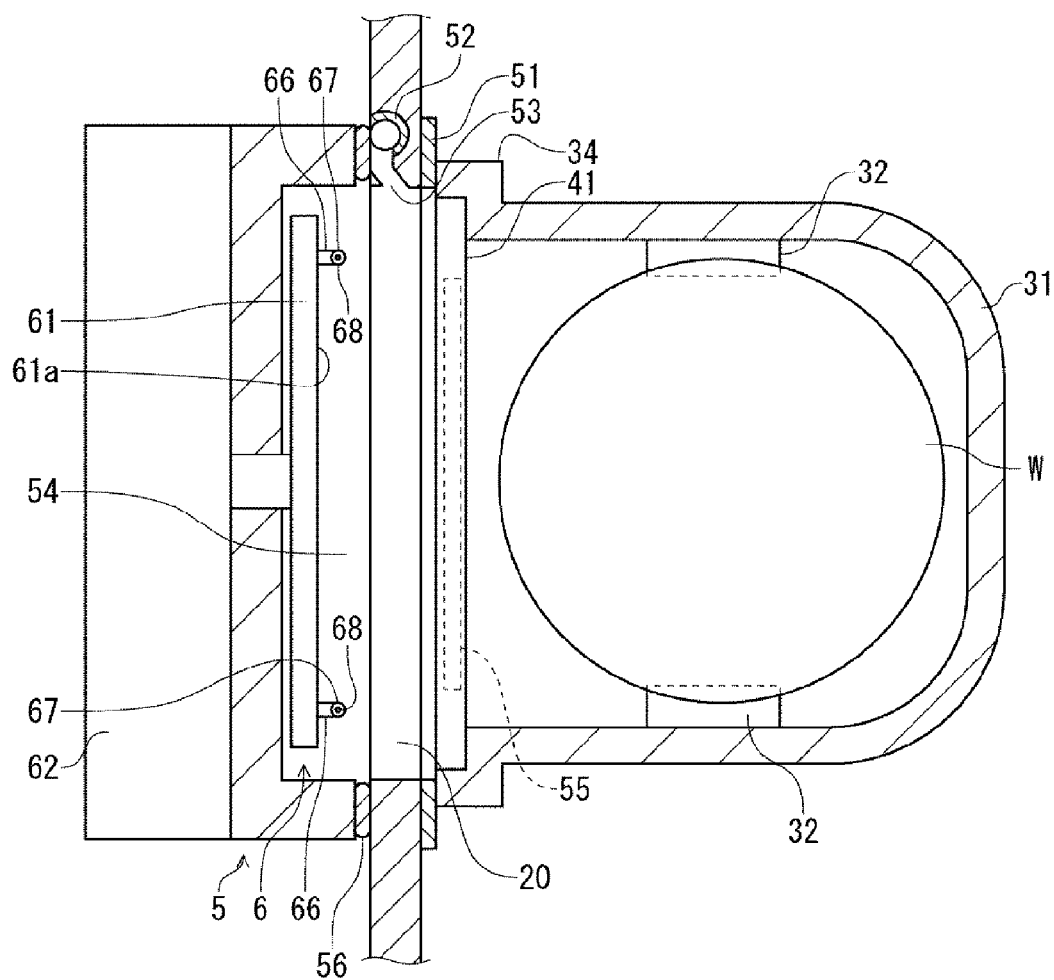
FIG. 4 is a horizontal top sectional view of the carrier and the opening/closing door.
Figure 5:
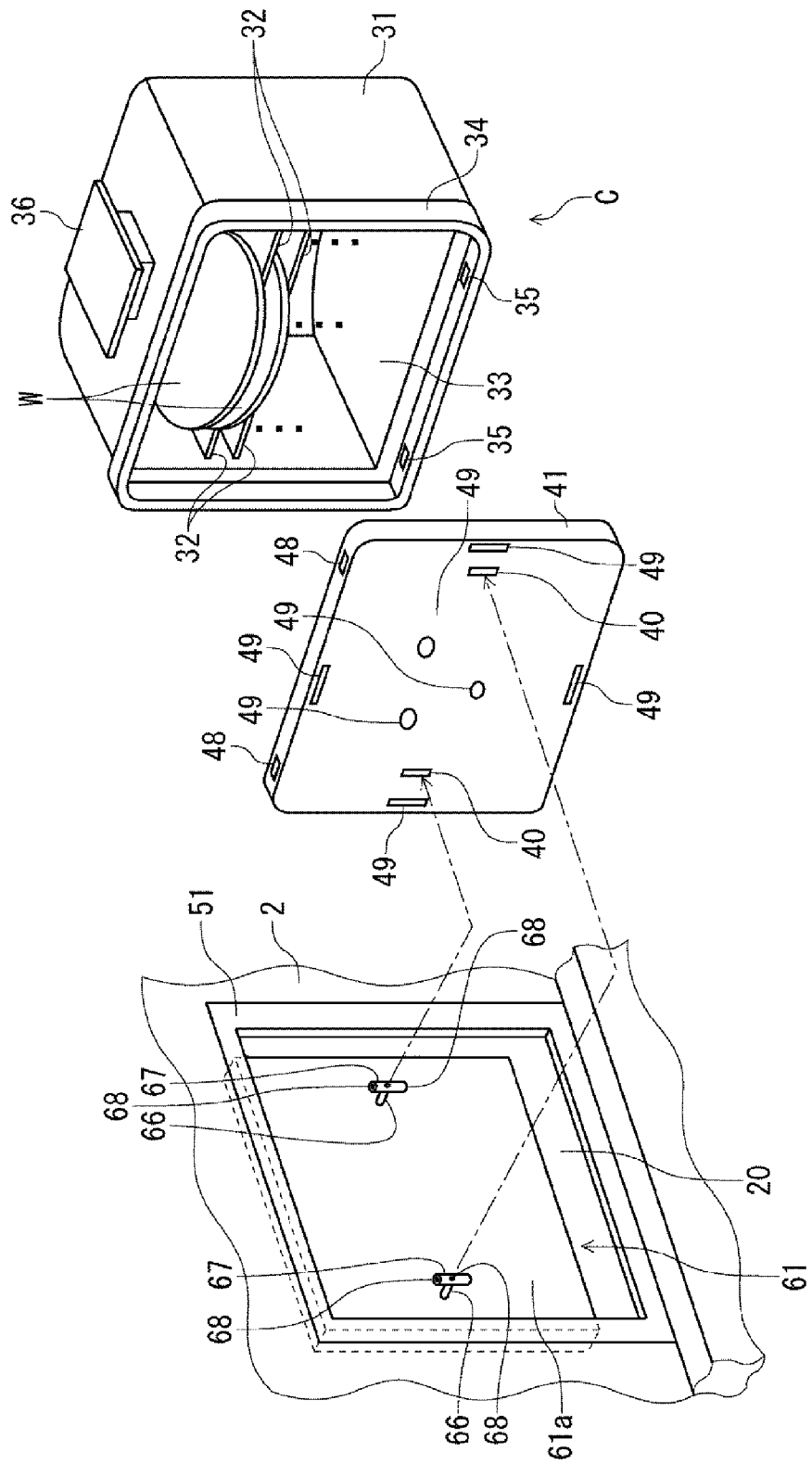
FIG. 5 is a perspective view of the carrier and the conveying gateway in which the opening/closing door is installed.

FIGS. 3 and 4 are vertical and horizontal sectional views of the carrier C, the conveying gateway 20 for the wafers W and the opening/closing door 5, respectively. FIG. 5 is a perspective view of the conveying gateway 20 and the carrier C. In FIGS. 3 and 4, there is shown a state where the carrier C has been moved by the second tables 16 to a transfer position for transferring the wafers W between the carrier C and the wafer conveying region S2. The carrier C will be described with reference to FIGS. 3 through 5. The carrier C includes a carrier body 31 as a container body and a lid 41. At the left and right sides within the carrier body 31, support portions 32 for supporting the peripheral edge portions of the rear surfaces of the wafers W are installed as multiple stages. A wafer takeout opening 33 is formed on the front surface of the carrier body 31. In the figures, reference numeral 34 refers to an edge part of the takeout opening 33. Engaging grooves 35 are formed in the left and right portions of the upper and lower regions of the inner circumferential surface of the edge part 34.

In the upper portion of the carrier body 31, there is installed a grip portion 36 gripped by the carrier conveying mechanism 21 for the conveyance of the carrier C. As shown in FIG. 3, a plurality of recess portions 37 and a groove portion 38 are formed in the lower region of the carrier body 31. The recess portions 37 are fitted to the pins 15 of the first table 14 and the second table 16. The groove portion 38 engages with the hook 16a of the second table 16, whereby the carrier body 31 is fixed to the second table 16.

The lid 41 of the carrier C will be described with reference to FIG. 6. An internal space 42 is formed in the lid 41. Disc-shaped rotary parts 43 rotatable about horizontal axes are installed at the left and right sides of the internal space 42. Each of the rotary parts 43 includes an engaging hole 44 enabled to receive a key 67 to be described later and slits 45. Linear movement parts 46 are installed at the upper and lower sides of each of the rotary parts 43. At the base end side of each of the linear movement parts 46, there is provided a pin 46a extending in the thickness direction of the lid 41 and entering the corresponding one of the slits 45. As the rotary parts 43 is rotated 90 degrees, the pin 46a is moved along the corresponding slit 45 in accordance with the movement of the slits 45, thereby moving the linear movement parts 46 in the up-down direction. In response, the engaging sections 47 forming the tip ends of the linear movement parts 46 protrude outward of the lid 41 through the openings 48 formed on the side surfaces of the lid 41. Reference numeral 46b refers to guide members for guiding the linear movement parts 46. The engaging sections 47 protruding outward of the lid 41 come into engagement with the engaging grooves 35 of the edge part 34 of the carrier body 31, whereby the lid 41 is fixed to the carrier body 31.

Figure 6:
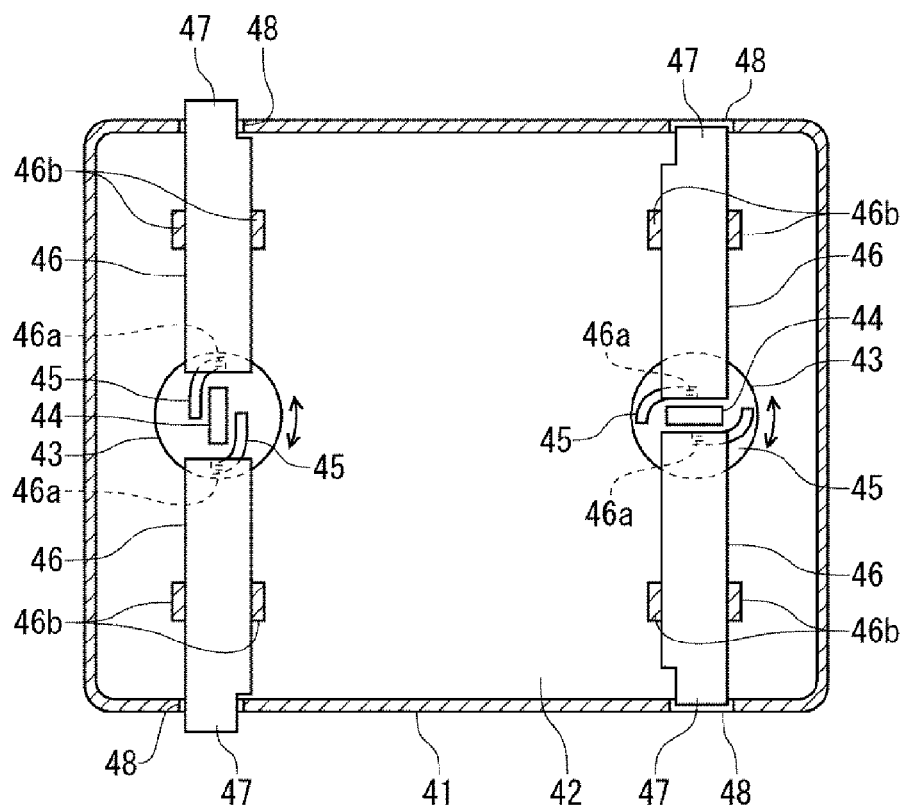
FIG. 6 is a vertical side sectional view showing a lid of the carrier.

The engaging sections 47 positioned at the left side in FIG. 6 protrude outward of the lid 41 to fix the lid 41. The engaging sections 47 positioned at the right side in FIG. 6 are retracted into the internal space 42 to release the lid 41. In reality, the left and right engaging sections 47 retract into the internal space 42 and protrude outward of the lid 41 in synchronism with each other.

As shown in FIG. 5, key insertion holes (opening) 40 for the insertion of keys 67 are formed on the front surface of the lid 41 in an overlapping relationship with the engaging holes 44 of the rotary parts 43. Openings 49 are formed at a plurality of points on the front surface of the lid 41. For the sake of easier understanding of the drawings, the shape, position and number of the openings 49 are shown to be different from the actual ones. The openings 49 are formed to regulate pressures in the inside and outside of the lid 41 and to reduce the weight of the lid 41.

Subsequently, description will be made on the opening/closing door 5 and the wafer conveying gateway 20. In the edge portion of the conveying gateway 20 facing the carrier conveying region 51, a seal member 51 is provided in a position of making contact with the edge part 34 of the carrier body 31. As shown in FIG. 4, an $N_2$ gas supply pipe 52 is vertically installed in one side edge portion of the conveying gateway 20. The $N_2$ gas supply pipe 52 is provided with upper and lower gas supply holes 53 and is configured to supply an $N_2$ gas into a closed space 54 formed in the wafer transfer position and surrounded by the carrier C and the opening/closing door 5. A horizontally-extending exhaust port 55 is provided in the lower end portion of the conveying gateway 20. In FIG. 3, reference numeral 55a refers to a porous body installed in the exhaust port 55 to restrain unbalanced exhaust in the horizontal direction.

The opening/closing door 5 is formed into a box-like shape with the peripheral edge portion thereof bent toward the carrier conveying region S1. A seal member 56 is installed at the edge portion of the opening/closing door 5. The opening/closing door 5 makes contact with the edge portion of the conveying gateway 20 by way of the seal member 56.

Figure 7:
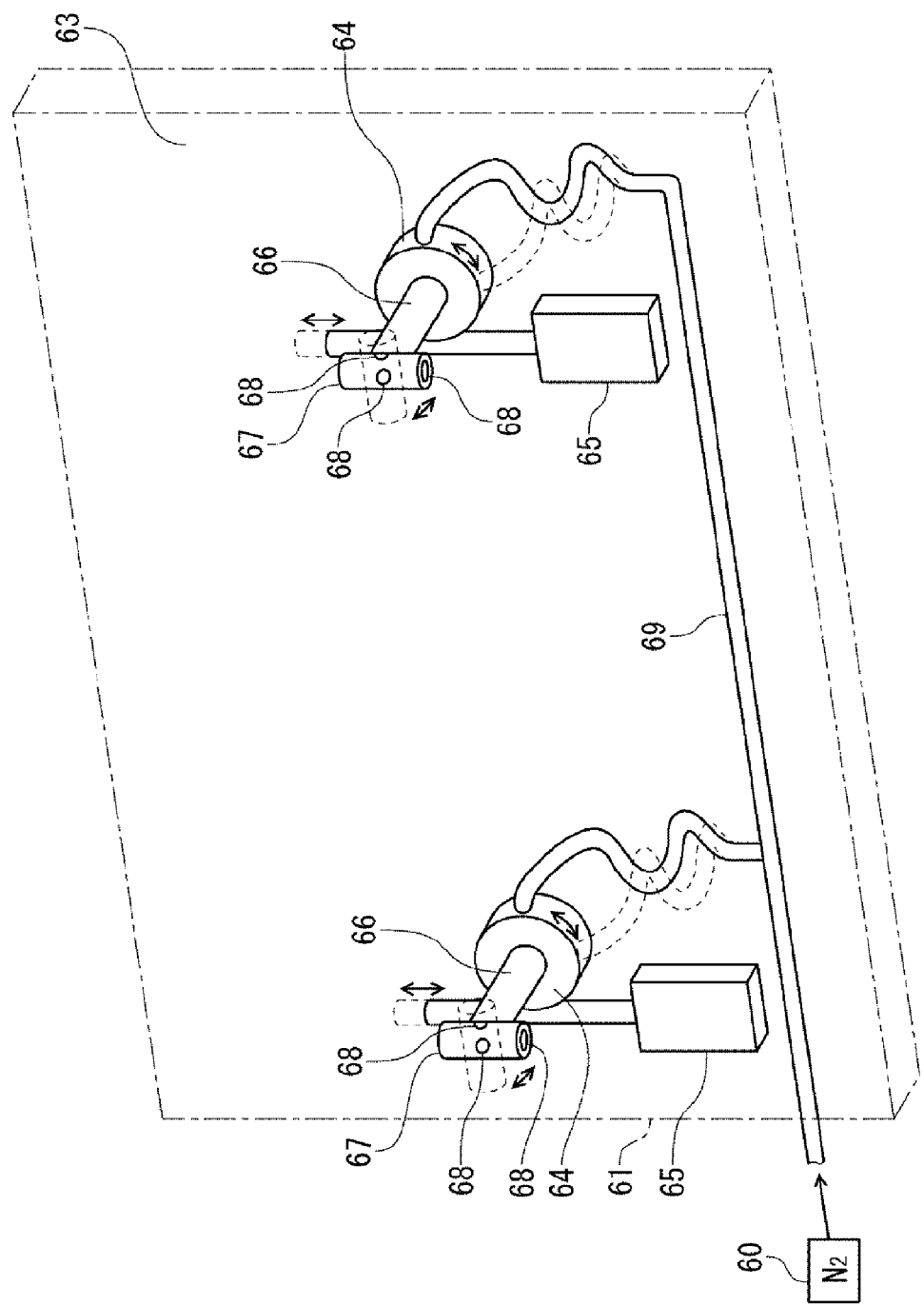
FIG. 7 is a perspective view showing a lid removal mechanism installed in the opening/closing door.

A removal mechanism 6 for removing the lid 41 is installed at the surface of the opening/closing door 5 facing the carrier conveying region S1. The removal mechanism 6 includes an opposing plate 61 facing the lid 41. The opposing plate 61 can be moved in the front-rear direction by an advancing/retreating mechanism 62. In the figures, reference numeral 61a refers to an opposing surface facing the lid 41. FIG. 7 is a perspective view showing the configuration of the opposing plate 61. An internal space 63 is formed within the opposing plate 61. In the internal space 63, there are provided circular rotary parts 64 rotatable about horizontal axes and air cylinders 65 connected to the rotary parts 64 to rotate the rotary parts 64. Rod-shaped connecting parts 66 horizontally extend from the rotation centers of the rotary parts 64 to penetrate the opposing surface 61a. Keys (latch pins) 67 having, e.g., a circular rod shape, are provided at the tip ends of the connecting parts 66. The keys 67 are formed to engage with the engaging holes 44 of the rotary parts 43 of the lid 41. The shape of the keys 67 is not limited to the circular column shape because the keys 67 need only to engage with engaging holes 44. The keys 67 may have, e.g., a polygonal column shape. The edge portions of the circular columnar keys or the polygonal columnar keys may be formed into a round shape.

Figure 8:
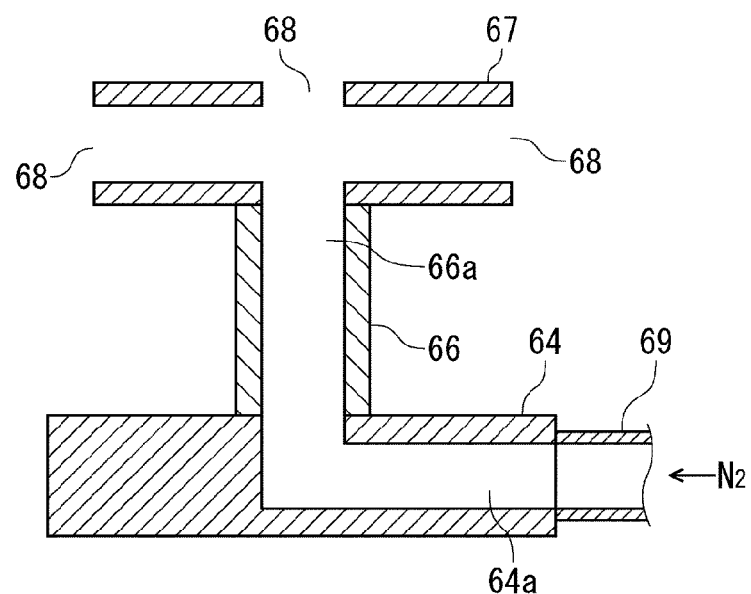
FIG. 8 is a horizontal top sectional view showing keys installed in the opening/closing door.
Figure 9:
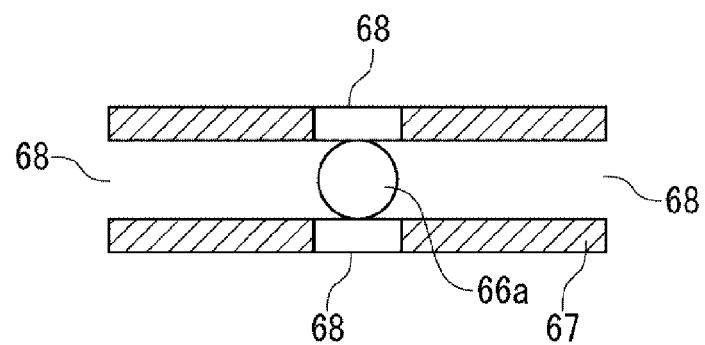
FIG. 9 is a vertical side sectional view of the keys.

Referring to FIGS. 8 and 9, the key 67 includes a purge gas injecting part having gas injecting holes 68 formed, respectively, at the longitudinal opposite ends of the key 67, at the end of the key 67 in the extension direction of the connecting portion 66 and at the left and right side of the key 67 as seen in the extension direction of the connecting part 66. Each of the gas injecting holes 68 has a diameter of, e.g., 1 mm to 2 mm. The respective gas injecting holes 68 are connected at their upstream sides to gas flow paths 66a and 64a formed in the connecting part 66 and the rotary part 64, respectively. The gas flow path 64a communicates with a pipeline 69. The pipeline 69 is connected at its upstream side to an $N_2$ gas source 60. The pipeline 69 is formed of a so-called flexible pipeline and is configured to flex in compliance with the rotation of the rotary part 64 so that the pipeline 69 should not hinder the rotation of the rotary part 64.

In the vertical heat treatment apparatus 1, there is provided a control unit 1A comprising, for example, a computer. The control unit 1A includes a data processing unit comprising a CPU, a program, and a memory. Commands (individual steps) are included in the program so that the control unit 1A can send control signals to the respective parts of the vertical heat treatment apparatus 1 to perform the respective processing steps to be set forth below. The operations of conveying the carrier C, conveying the wafers W, opening or closing the lid 41, opening or closing the opening/closing door 5 and supplying an $N_2$ gas to the lid 41 are controlled by the control signals. Thus the wafers W are conveyed and processed in the manner described later. The program is stored in a computer-readable storage medium, e.g., a flexible disk, a compact disk, a hard disk, a magneto-optical disk or a memory card and is installed in the control unit 1A.

Figure 10:
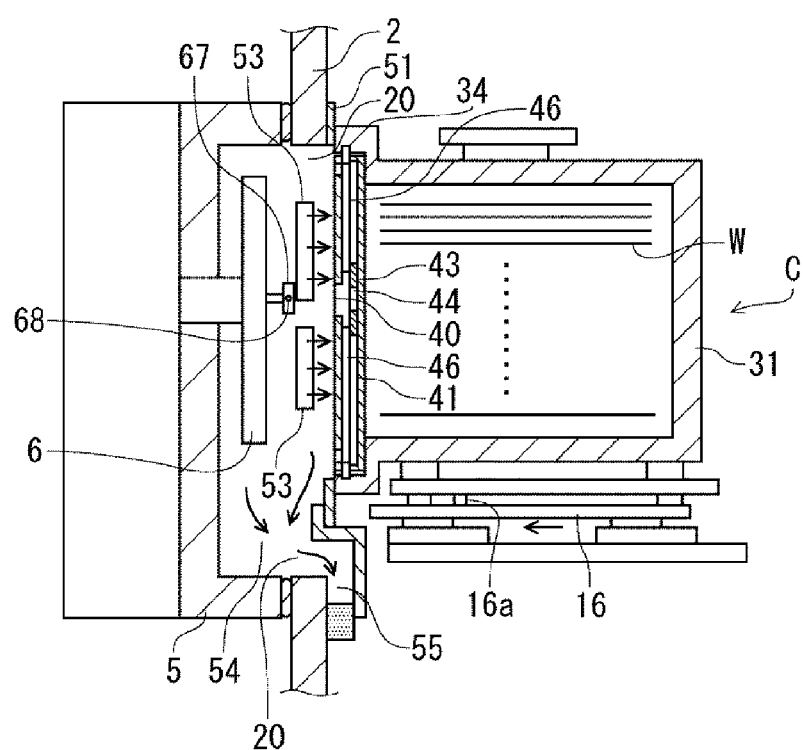
FIG. 10 is a process view illustrating a step of removing the lid.

Next, description will be made on the operation of the foregoing embodiment. First, the carrier C is placed on the first table 14 by an automatic conveying robot (not shown) that moves along the ceiling portion of a clean room. Subsequently, the carrier C is conveyed to the second table 16 by the carrier conveying mechanism 21 and is fixed to the second table 16 by the hook 16a. The second table 16 is moved toward the partition wall 2. As shown in FIG. 10, the edge part 34 of the carrier C comes into air-tight contact with the seal member 51 arranged around the conveying gateway 20 of the partition wall 2.

Figure 11:
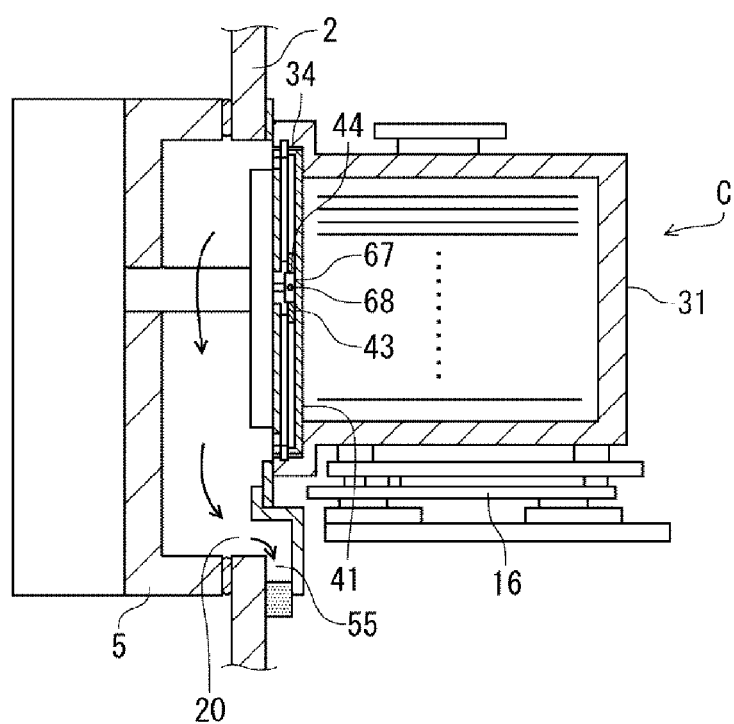
FIG. 11 is a process view illustrating another step of removing the lid.

Then, an $N_2$ gas is supplied from the gas supply holes 53 to the closed space 54 between the carrier C and the opening/closing door 5 and is discharged through the exhaust port 55. Thus the closed space 54 is converted from an air atmosphere to a nitrogen atmosphere. The opposing plate 61 is moved toward the lid 41. The keys 67 enter the internal space 42 of the lid 41 through the insertion holes 40 formed on the front surface of the lid 41. As shown in FIG. 11, the keys 67 are inserted into the engaging holes 44 of the rotary portions 43, thus coming into engagement with the rotary portions 43. At this time, as shown in FIG. 12, an $N_2$ gas is injected from the gas injecting holes 68 of the keys 67.

Figure 12:
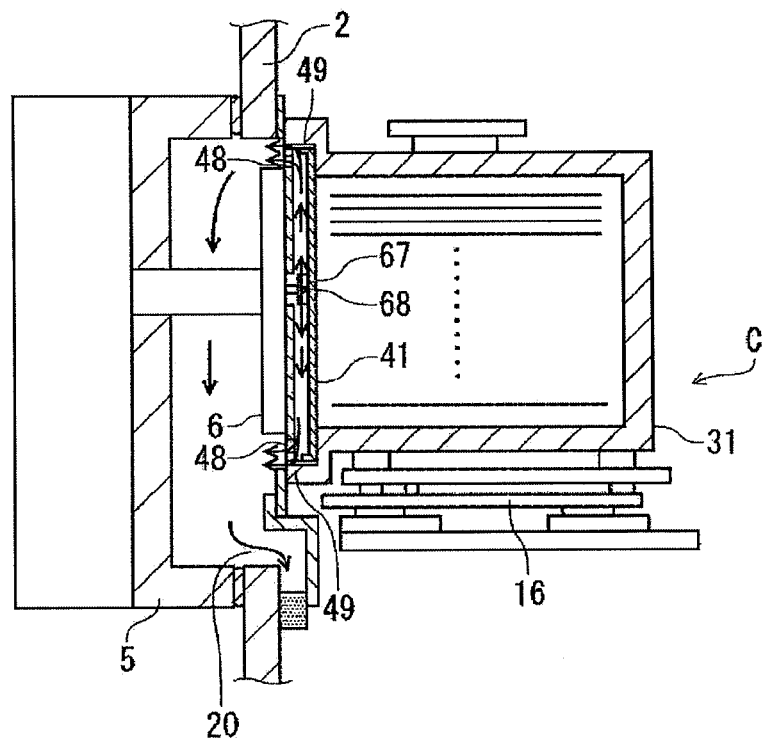
FIG. 12 is a process view illustrating a further step of removing the lid.

As indicated by arrows in FIG. 12, the $N_2$ gas injected from the gas injecting holes 68 flows from the front openings 49 and the side openings 48 of the lid 41 toward the closed space 54. Then, the $N_2$ gas is discharged to the outside. Due to the flow of the $N_2$ gas, the air staying in the internal space 42 of the lid 41 is purged into the closed space 54 and discharged from the closed space 54. Thus the atmosphere in the internal space 42 is rapidly converted to an $N_2$ gas atmosphere. In FIG. 12, the rotary parts 43 and the linear movement parts 46 arranged in the internal space 42 are omitted for the sake of simplicity.

Figure 13:
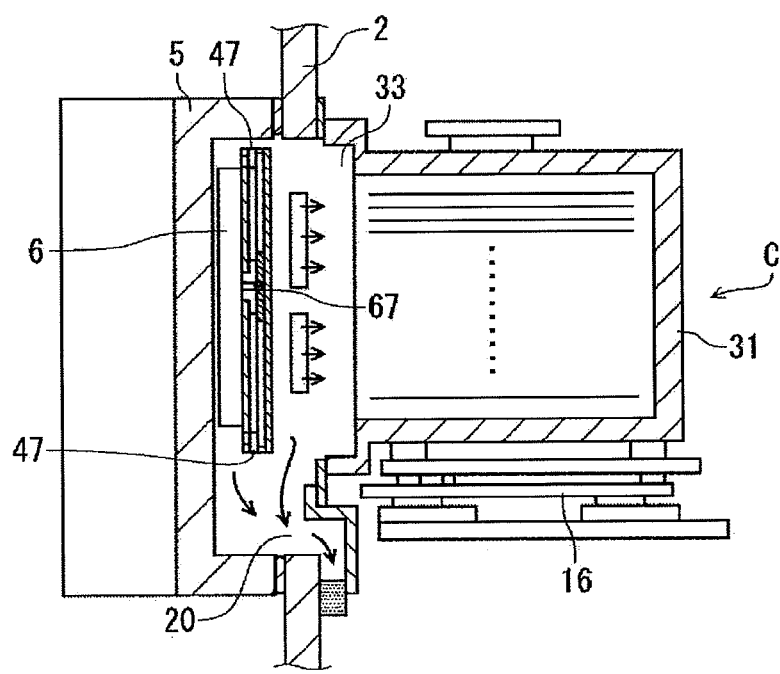
FIG. 13 is a process view illustrating a still further step of removing the lid.

If the injection of the $N_2$ gas from the gas injecting holes 68 is stopped, the keys 67 are rotated 90 degrees to rotate the rotary parts 43 of the lid 41. Thus the engaging sections 47 formed at the tip ends of the linear movement parts 46 retract into the lid 41 and disengage from the engaging grooves 35 of the carrier body 31, whereby the lid 41 is released from the engagement with the carrier body 31 and is held by the keys 67. Then, as shown in FIG. 13, the removal mechanism 6 is retreated toward the opening/closing door 5 with the lid 41 held by the keys 67. Consequently, the wafer takeout opening 33 of the carrier body 31 is opened.

Figure 14:
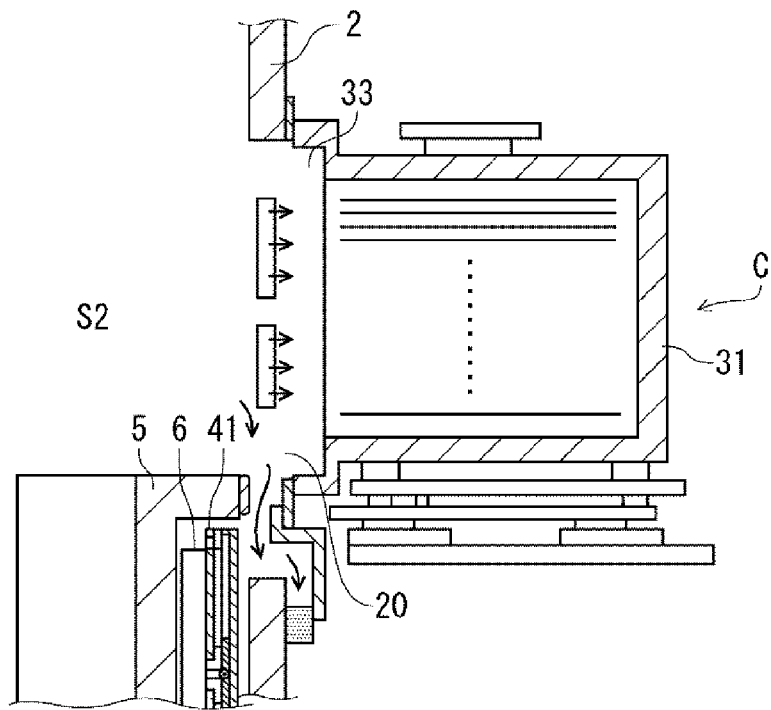
FIG. 14 is a process view illustrating a yet still further step of removing the lid.

Thereafter, the opening/closing door 5 is retreated, moved down and removed from the conveying gateway 20. As shown in FIG. 14, the inside of the carrier C is opened to the wafer conveying region S2. The wafers W stored within the carrier C are taken out one after another by the wafer conveying mechanism 27 and are transferred to the wafer boat 23. If all the wafers W are taken out from the carrier C, the lid 41 of the carrier C is closed through the operations opposite to the operations set forth above and is fixed to the carrier body 31. Thereafter, the second table 16 is retreated to move the carrier C away from the partition wall 2. The carrier C is conveyed to the carrier storage part 18 by the carrier conveying mechanism 21 and is temporarily stored in the carrier storage part 18. On the other hand, the wafer boat 23 holding the wafers W is carried into the heat treatment furnace 22. The wafers W are subjected to heat treatments, e.g., chemical vapor deposition, annealing and oxidizing. Thereafter, the processed wafers W are returned to the carrier C. At this time, the lid 41 is opened in the same order as applied when the wafers W are taken out from the carrier C.

In the vertical heat treatment apparatus 1 described above, the keys 67 having gas nozzles are provided in the lid removal mechanism 6. The keys 67 enter the internal space 42 of the lid 41 of the carrier C and inject an $N_2$ gas. As a result, the air existing in the internal space 42 is purged into the closed space 54 already exhausted. This prevents the air existing in the carrier conveying region S1 from entering the wafer conveying region S2 together with the lid when the opening/closing door 5 is opened. Accordingly, it is possible to keep the wafer conveying region S2 clean and to restrain any increase in the oxygen concentration. As a consequence, it is possible to restrain any decrease in the yield of the wafers W. Since an $N_2$ gas is injected from the keys 67 moved into the internal space 42, it is possible to rapidly and reliably purge the air.

In the first embodiment, gas nozzles differing from the keys 67 may be provided on the surface of the opposing plate 61 in positions of facing the openings 49 formed on the front surface of the lid 41. When the keys 67 are caused to enter the internal space 42, the gas nozzles are also moved into the internal space 42. An $N_2$ gas is injected from the gas nozzles to purge the internal space 42. However, the configuration in which the gas nozzles are built in the keys 67 as set forth above is advantageous because this configuration makes it possible to reduce the number of parts of the apparatus.

The timing at which the $N_2$ gas is injected from the keys 67 is not limited to the example described above. The injection of the $N_2$ gas may be performed during the time period between the insertion of the keys 67 and the opening of the opening/closing door 5. For example, the injection of the $N_2$ gas may be performed during rotation of the keys 67 and during the time when the lid 41 released from the carrier body 31 is conveyed toward the opening/closing door 5. It is possible to increase a throughput by simultaneously performing the removal operation of the lid 41 and the injection of the $N_2$ gas in this manner.

Figure 15:
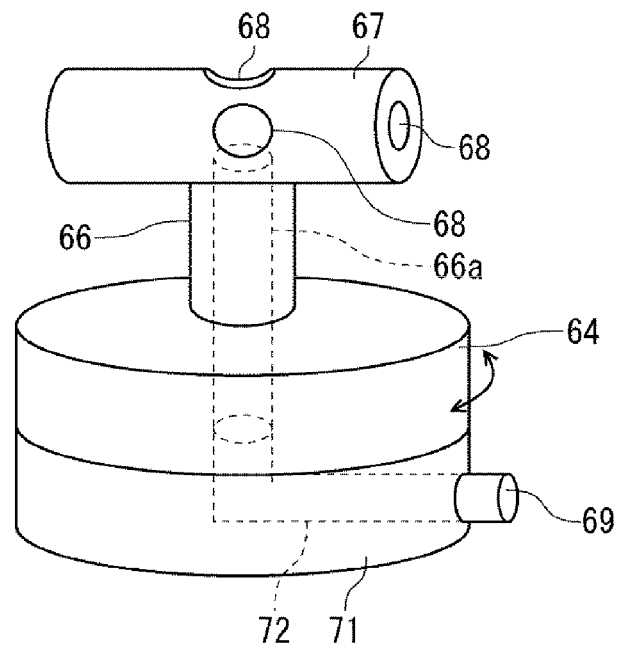
FIG. 15 is a perspective view showing another configuration of the key.

While the pipeline 69 is connected to the rotary part 64 of the removal mechanism 6 in the example described above, the present disclosure is not limited to this configuration but may have the configuration shown in FIG. 15. The pipeline 69 is connected to a base 71. The rotary part 64 is installed on the base 71. The rotary part 64 can be rotated with respect to the base 71 by the air cylinders 65 described above. A flow path 72 for interconnecting the pipeline 69 and the flow path 64a of the rotary part 64 is formed in the base 71. In other words, the base 71 is configured such that it has a so-called rotary joint. In this case, it is not necessary for the pipeline 69 to flex in response to the rotation of the rotary part 64. Therefore, the pipeline 69 may be formed of a hard material.

<Modified Example of First Embodiment>

Figure 16:
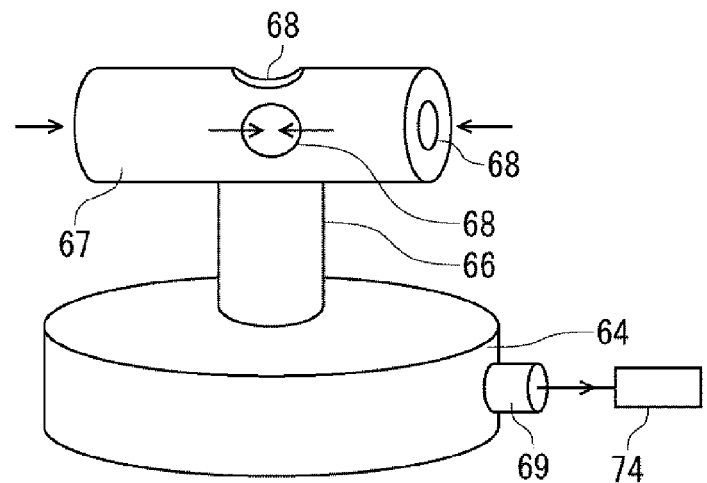
FIG. 16 is a perspective view showing a further configuration of the key.

In a modified example of the first embodiment, a gas may be discharged from the keys 67 instead of injecting an $N_2$ gas from the keys 67. FIG. 16 shows an example in which, instead of the $N_2$ gas source 60, an exhaust mechanism 74 formed of a vacuum pump is connected to the upstream end of the pipeline 69. In this example, the keys 67 constitutes an exhaust part and the gas injecting holes 68 make up exhaust holes. As in the first embodiment, a gas may be discharged from the exhaust holes 68 during the time period between the entry of the keys 67 into the internal space 42 of the lid 41 and the opening of the opening/closing door 5. Thus the air is removed from the internal space 42. Accordingly, in the same manner as the first embodiment, it is possible to restrain the atmosphere of the wafer conveying region S2 from falling into disarray.

<Second Embodiment>

Figure 17:
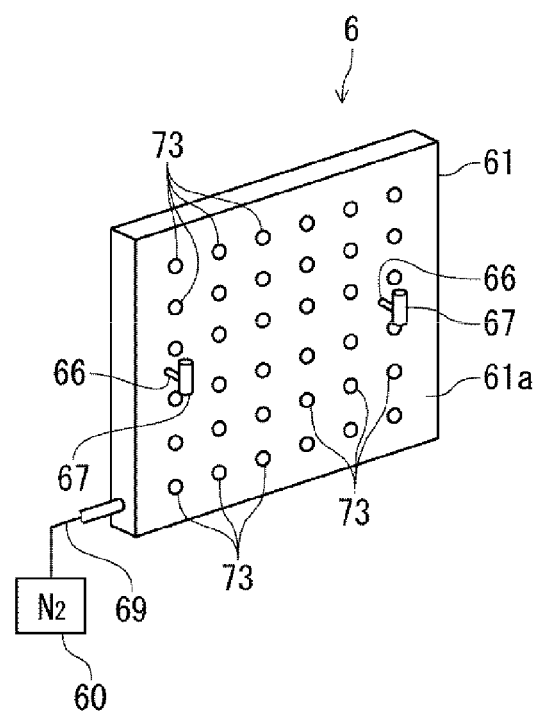
FIG. 17 is a perspective view showing another configuration of the lid removal mechanism.

Next, a second embodiment will be described with a focus on the differences from the first embodiment. FIG. 17 is a perspective view of a lid removal mechanism 6 according to the second embodiment. In this removal mechanism 6, the gas injecting holes 68 are not formed in the keys 67. Instead, a plurality of gas injecting holes 73 is formed on the opposing surface 61a of the opposing plate 61. The gas injecting holes 73 are connected to the internal space 63 of the opposing plate 61. The downstream end of a gas supply pipe 69 is opened into the internal space 63. An $N_2$ gas flowing into the internal space 63 is injected from the gas injecting holes 73 in the thickness direction of the opposing plate 61. In this example, the opposing plate 61 makes up a purge gas injecting unit having a shower head shape.

Figure 18:
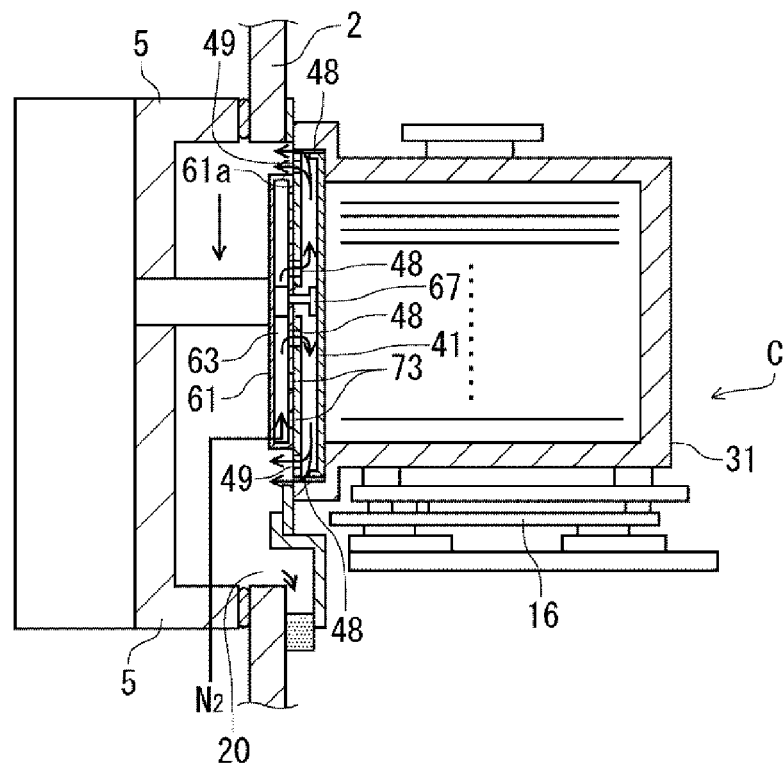
FIG. 18 is an explanatory view showing how the internal space of the lid is purged by the lid removal mechanism.

For example, as shown in FIG. 18, an $N_2$ gas is injected from the gas injecting holes 73 in a state where the keys 67 engage with the rotary parts 43 of the lid 41. The $N_2$ gas is supplied to the internal space 42 from the openings 49 formed on the front surface of the lid 41 in a region overlapping with the opposing surface 61a. Then, the $N_2$ gas is discharged to the closed space 54 through the openings 49 formed on the front surface of the lid 41 in a region outside the opposing surface 61a and the openings 48 formed on the side surface of the lid 41. Thus the second embodiment provides the same effect as provided by the first embodiment.

Figure 19:
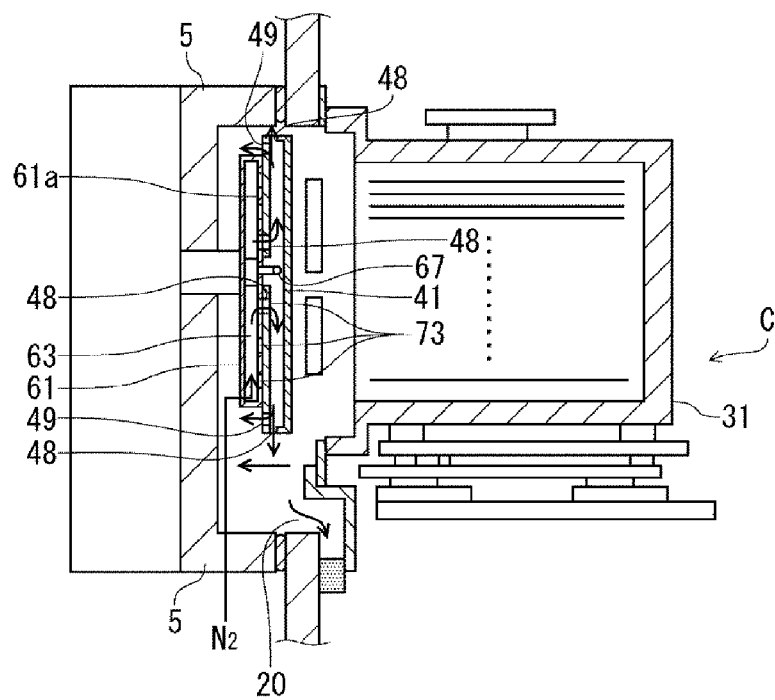
FIG. 19 is an explanatory view showing how the internal space of the lid is purged by the lid removal mechanism.
Figure 20:
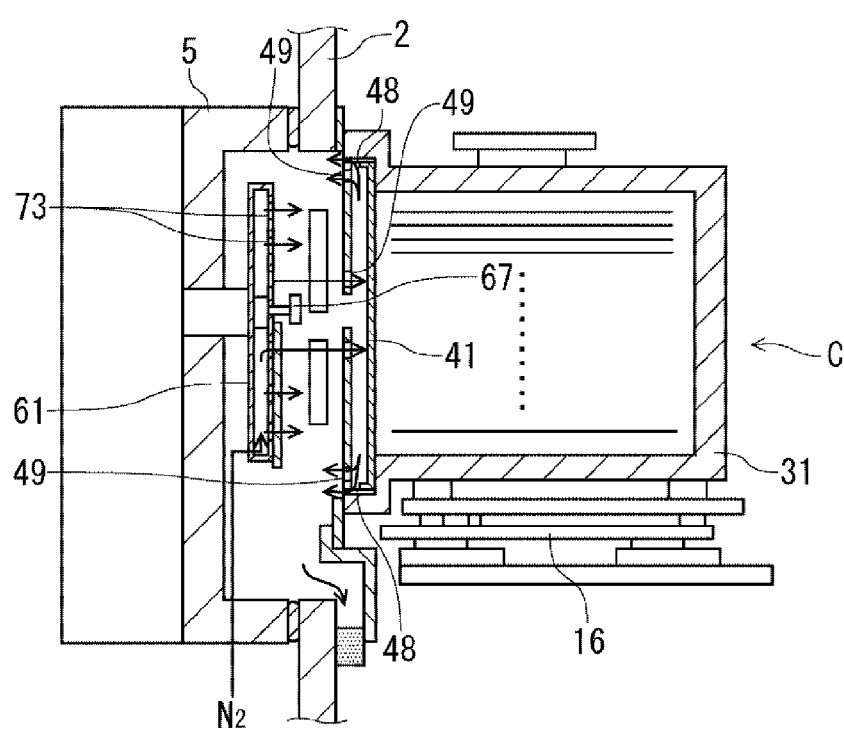
FIG. 20 is an explanatory view showing how the internal space of the lid is purged by the lid removal mechanism.

In the second embodiment, in the same manner as the first embodiment, the injection of the $N_2$ gas from the gas injecting holes 73 may be performed during retreat of the removal mechanism 6 as shown in FIG. 19 or during rotation of the keys 67. In some embodiments, the $N_2$ gas may be injected at the time when the keys 67 enter the internal space 42, while in other embodiments the $N_2$ gas may be injected during the time period between the movement of the carrier C into the transfer position and the entry of the keys 67 into the internal space 42. The reason is that the gas injecting holes 73 come closer to the lid 41 and can rapidly purge the internal space 42.

In the second embodiment, the opposing plate 61 may be configured in a shower head shape such that the internal space 42 of the lid 41 can be purged even if the openings 49 on the front surface of the lid 41 differ from carrier C to carrier C. Alternatively, the opposing surface 61a may be formed of a porous material so that an $N_2$ gas can be injected from the entire area of the opposing surface 61a. This configuration makes it possible to more reliably supply an $N_2$ gas into the internal space 42. As described above in respect of the modified example of the first embodiment, an exhaust mechanism 74 may be connected in place of the $N_2$ gas source 60 and the gas injecting holes 73 may be used as exhaust holes to exhaust the internal space 42. The exhaust can be performed at the same time as the supply of the $N_2$ gas.

In the first and second embodiments, an ionizing device may be installed in the pipeline 69 to supply a gas containing ions to the lid 41 so that the particles adhering to the lid 41 can be removed with ease. Moreover, all the first and second embodiments may be applied to the apparatus. While various embodiments have been described in which the objects to be processed are semiconductor wafers, the objects to be processed are not limited to the semiconductor wafers, and may be other materials such as, but not limited to, glass substrates or LCD substrates. In addition, the opening/closing door 5 and the partition wall 2 may be configured not only to divide the air atmosphere and the inert gas atmosphere but also to divide, e.g., regions differing in humidity from each other.

In one lid opening and closing device according to the present disclosure, the purge gas injecting unit may enter the internal space of the lid of the FOUP to discharge the atmospheric gas existing within the internal space, or the exhaust unit may enter the internal space to discharge the atmospheric gas. In addition, a purge gas may be injected from a plurality of injection holes facing the front surface of the lid to discharge the atmospheric gas existing within the internal space, or the atmospheric gas existing within the internal space may be discharged from a plurality of exhaust holes facing the front surface of the lid. Accordingly, it is possible to restrain the atmospheric gas existing in the FOUP conveying region from infiltrating into the substrate conveying region through the internal space of the lid.

While various embodiments have been described, these embodiments have been presented by way of example only, and are not intended to limit the scope of the disclosures. Indeed, the novel devices described herein may be embodied in a variety of other forms or in a variety of combinations of various aspects of the embodiments; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A lid opening and closing device for a semiconductor manufacturing apparatus which comprises:
    a partition wall configured to divide a carrier conveying region and a substrate conveying region, the partition wall having a conveying gateway with an edge portion;
    a carrier including a carrier body and a carrier lid configured to removably engage with the carrier body, the carrier body having a substrate takeout opening with an edge part, the carrier lid having an internal space and an opening on the front surface thereof, the edge part of the substrate takeout opening of the carrier body being configured to make contact with the edge portion of the conveying gateway; and
    an opening/closing door configured to open and close the conveying gateway, the opening/closing door including a lid removal mechanism configured to enter the carrier lid to release engagement of the carrier lid with the carrier body and to hold the carrier lid, the lid opening and closing device comprising:
    an exhaust port configured to discharge therethrough an atmospheric gas from a closed space formed between the carrier making contact with the edge portion of the conveying gateway and the opening/closing door; and
    a purge gas injecting part provided in the opening/closing door, the purge gas injecting part configured to enter the internal space of the carrier lid through said opening of the carrier lid, to inject a purge gas into the internal space of the carrier lid and to discharge an atmospheric gas existing in the internal space of the carrier lid into the closed space through another opening of the carrier lid.

2. A lid opening and closing device for a semiconductor manufacturing apparatus which comprises:
    a partition wall configured to divide a carrier conveying region and a substrate conveying region, the partition wall having a conveying gateway with an edge portion;
    a carrier including a carrier body and a carrier lid configured to removably engage with the carrier body, the carrier body having a substrate takeout opening with an edge part, the carrier lid having an internal space and an opening on the front surface thereof, the edge part of the substrate takeout opening of the carrier body being configured to make contact with the edge portion of the conveying gateway; and
    an opening/closing door configured to open and close the conveying gateway, the opening/closing door including a lid removal mechanism configured to enter the carrier lid to release engagement of the carrier lid with the carrier body and to hold the carrier lid, the lid opening and closing device comprising:
    an exhaust port configured to discharge therethrough an atmospheric gas from a closed space formed between the carrier making contact with the edge portion of the conveying gateway and the opening/closing door; and
    an exhaust part provided in the opening/closing door, the exhaust part configured to enter the internal space of the carrier lid through said opening of the carrier lid and to discharge therethrough an atmospheric gas existing in the internal space of the carrier lid.

3. The device of claim 1, wherein the purge gas injecting part is provided in the lid removal mechanism.

4. A lid opening and closing device for a semiconductor manufacturing apparatus which includes:
    a partition wall configured to divide a carrier conveying region and a substrate conveying region, the partition wall having a conveying gateway with an edge portion;
    a carrier including a carrier body and a carrier lid configured to removably engage with the carrier body, the carrier body having a substrate takeout opening with an edge part, the carrier lid having an internal space and an opening on the front surface thereof, the edge part of the substrate takeout opening of the carrier body being configured to make contact with the edge portion of the conveying gateway; and
    an opening/closing door configured to open and close the conveying gateway, the opening/closing door including a lid removal mechanism configured to enter the carrier lid to release engagement of the carrier lid with the carrier body and to hold the carrier lid, the lid opening and closing device comprising:
    an exhaust port configured to discharge therethrough an atmospheric gas from a closed space formed between the carrier making contact with the edge portion of the conveying gateway and the opening/closing door; and
    a purge gas injecting part including an opposing surface facing a front surface of the carrier lid and a plurality of purge gas injecting holes formed on the opposing surface, the lid removal mechanism provided in the purge gas injecting part, the purge gas injecting part configured to inject a purge gas into the internal space of the carrier lid through said opening of the carrier lid and to discharge an atmospheric gas existing in the internal space of the carrier lid into the closed space through another opening of the carrier lid.

5. A lid opening and closing device for a semiconductor manufacturing apparatus which comprises:
- a partition wall configured to divide a carrier conveying region and a substrate conveying region, the partition wall having a conveying gateway with an edge portion;
- a carrier including a carrier body and a carrier lid configured to removably engage with the carrier body, the carrier body having a substrate takeout opening with an edge part, the carrier lid having an internal space and an opening on the front surface thereof, the edge part of the substrate takeout opening of the carrier body being configured to make contact with the edge portion of the conveying gateway; and
- an opening/closing door configured to open and close the conveying gateway, the opening/closing door including a lid removal mechanism configured to enter the carrier lid to release engagement of the carrier lid with the carrier body and to hold the carrier lid, the lid opening and closing device comprising:
- an exhaust port configured to discharge therethrough an atmospheric gas from a closed space formed between the carrier making contact with the edge portion of the conveying gateway and the opening/closing door; and
- an exhaust part including an opposing surface facing a front surface of the carrier lid and a plurality of exhaust holes formed on the opposing surface, the lid removal mechanism provided in the exhaust part, the exhaust part configured to discharge an atmospheric gas existing in the internal space of the carrier lid through said opening of the carrier lid.

6. The device of claim 1, wherein the atmospheric gas in the carrier conveying region is air and the atmospheric gas in the substrate conveying region is an inert gas, the purge gas being the inert gas.

* * * * *